(12) United States Patent
Lester et al.

(10) Patent No.: US 8,684,749 B2
(45) Date of Patent: Apr. 1, 2014

(54) LED WITH IMPROVED INJECTION EFFICIENCY

(71) Applicant: Toshiba Techno Center Inc., Tokyo (JP)

(72) Inventors: Steven Lester, Sunnyvale, CA (US); Jeff Ramer, Sunnyvale, CA (US); Jun Wu, San Ramon, CA (US); Ling Zhang, San Jose, CA (US)

(73) Assignee: Toshiba Techno Center Inc., Tokyo (JP)

( * ) Notice: Subject to any disclaimer, the term of this patent is extended or adjusted under 35 U.S.C. 154(b) by 0 days.

(21) Appl. No.: 13/959,297

(22) Filed: Aug. 5, 2013

(65) Prior Publication Data

US 2013/0316483 A1    Nov. 28, 2013

Related U.S. Application Data

(62) Division of application No. 12/626,474, filed on Nov. 25, 2009, now Pat. No. 8,525,221.

(51) Int. Cl.
*H01L 21/00* (2006.01)

(52) U.S. Cl.
USPC ............. 439/22; 438/43; 438/44; 438/45; 438/46; 438/47; 257/101; 257/E27.12; 257/79; 257/12; 257/1

(58) Field of Classification Search
USPC ............ 257/12–19, 79, 101–103, E27.12; 438/22, 29, 42–47
See application file for complete search history.

(56) References Cited

U.S. PATENT DOCUMENTS

| 5,306,662 | A | 4/1994 | Nakamura et al. |
| 5,408,120 | A | 4/1995 | Manabe et al. |
| 5,468,678 | A | 11/1995 | Nakamura et al. |

(Continued)

FOREIGN PATENT DOCUMENTS

| JP | 2626431 | 5/1994 |
| JP | 2681733 | 5/1994 |

(Continued)

OTHER PUBLICATIONS

International Seach Report and Written Opinion, PCT/US2010/051205, Apr. 29, 2011.

(Continued)

*Primary Examiner* — Telly Green
(74) *Attorney, Agent, or Firm* — Hogan Lovells US LLP

(57) ABSTRACT

A light emitting device and method for making the same is disclosed. The light-emitting device includes an active layer sandwiched between a p-type semiconductor layer and an n-type semiconductor layer. The active layer emits light when holes from the p-type semiconductor layer combine with electrons from the n-type semiconductor layer therein. The active layer includes a number of sub-layers and has a plurality of pits in which the side surfaces of a plurality of the sub-layers are in contact with the p-type semiconductor material such that holes from the p-type semiconductor material are injected into those sub-layers through the exposed side surfaces without passing through another sub-layer. The pits can be formed by utilizing dislocations in the n-type semiconductor layer and etching the active layer using an etching atmosphere in the same chamber used to deposit the semiconductor layers without removing the partially fabricated device.

8 Claims, 7 Drawing Sheets

(56) References Cited

U.S. PATENT DOCUMENTS

| | | | |
|---|---|---|---|
| 5,563,422 A | 10/1996 | Nakamura et al. |
| 5,578,839 A | 11/1996 | Nakamura et al. |
| 5,734,182 A | 3/1998 | Nakamura et al. |
| 5,747,832 A | 5/1998 | Nakamura et al. |
| 5,753,939 A | 5/1998 | Sassa et al. |
| 5,777,350 A | 7/1998 | Nakamura et al. |
| 5,959,307 A | 9/1999 | Nakamura et al. |
| 5,959,401 A | 9/1999 | Asami et al. |
| 6,005,258 A | 12/1999 | Manabe et al. |
| 6,040,588 A | 3/2000 | Koide et al. |
| RE36,747 E | 6/2000 | Manabe et al. |
| 6,215,133 B1 | 4/2001 | Nakamura et al. |
| 6,265,726 B1 | 7/2001 | Manabe et al. |
| 6,326,236 B1 | 12/2001 | Koide et al. |
| 6,329,667 B1 | 12/2001 | Ota et al. |
| 6,420,733 B2 | 7/2002 | Koide et al. |
| 6,541,293 B2 | 4/2003 | Koide et al. |
| 6,610,995 B2 | 8/2003 | Nakamura et al. |
| 6,657,236 B1 | 12/2003 | Thibeault et al. |
| 6,800,500 B2 | 10/2004 | Coman et al. |
| 6,838,693 B2 | 1/2005 | Kozaki |
| 6,849,881 B1 | 2/2005 | Harle et al. |
| 6,891,197 B2 | 5/2005 | Bhat et al. |
| 6,906,352 B2 | 6/2005 | Edmond et al. |
| 6,916,676 B2 | 7/2005 | Sano et al. |
| 6,951,695 B2 | 10/2005 | Xu et al. |
| 6,977,395 B2 | 12/2005 | Yamada et al. |
| 7,026,653 B2 | 4/2006 | Sun |
| 7,106,090 B2 | 9/2006 | Harle et al. |
| 7,115,908 B2 | 10/2006 | Watanabe et al. |
| 7,138,286 B2 | 11/2006 | Manabe et al. |
| 7,193,246 B1 | 3/2007 | Tanizawa et al. |
| 7,262,436 B2 | 8/2007 | Kondoh et al. |
| 7,312,474 B2 | 12/2007 | Emerson et al. |
| 7,335,920 B2 | 2/2008 | Denbaars et al. |
| 7,345,297 B2 | 3/2008 | Yamazoe et al. |
| 7,348,602 B2 | 3/2008 | Tanizawa |
| 7,402,838 B2 | 7/2008 | Tanizawa et al. |
| 7,442,966 B2 | 10/2008 | Bader et al. |
| 7,446,345 B2 | 11/2008 | Emerson et al. |
| 7,491,565 B2 | 2/2009 | Coman et al. |
| 7,547,908 B2 | 6/2009 | Grillot et al. |
| 7,611,917 B2 | 11/2009 | Emerson et al. |
| 7,635,875 B2 | 12/2009 | Niki et al. |
| 7,709,851 B2 | 5/2010 | Bader et al. |
| 7,737,459 B2 | 6/2010 | Edmond et al. |
| 7,754,514 B2 | 7/2010 | Yajima et al. |
| 7,791,061 B2 | 9/2010 | Edmond et al. |
| 7,791,101 B2 | 9/2010 | Bergmann et al. |
| 7,795,623 B2 | 9/2010 | Emerson et al. |
| 7,910,945 B2 | 3/2011 | Donofrio et al. |
| 7,939,844 B2 | 5/2011 | Hahn et al. |
| 7,947,994 B2 | 5/2011 | Tanizawa et al. |
| 8,021,904 B2 | 9/2011 | Chitnis |
| 8,030,665 B2 | 10/2011 | Nagahama et al. |
| 2003/0001161 A1 | 1/2003 | Ota et al. |
| 2006/0246612 A1 | 11/2006 | Emerson et al. |
| 2007/0057249 A1* | 3/2007 | Kim et al. ............... 257/14 |
| 2009/0191658 A1 | 7/2009 | Kim et al. |

FOREIGN PATENT DOCUMENTS

| | | |
|---|---|---|
| JP | 2917742 | 6/1994 |
| JP | 2827794 | 8/1994 |
| JP | 2778405 | 9/1994 |
| JP | 2803741 | 9/1994 |
| JP | 2785254 | 1/1995 |
| JP | 2735057 | 3/1996 |
| JP | 2956489 | 3/1996 |
| JP | 2666237 | 12/1996 |
| JP | 2890396 | 12/1996 |
| JP | 3250438 | 12/1996 |
| JP | 3135041 | 6/1997 |
| JP | 3209096 | 12/1997 |
| JP | 3506874 | 1/1998 |
| JP | 3654738 | 2/1998 |
| JP | 3795624 | 2/1998 |
| JP | 3304787 | 5/1998 |
| JP | 3344257 | 8/1998 |
| JP | 3223832 | 9/1998 |
| JP | 3374737 | 12/1998 |
| JP | 3314666 | 3/1999 |
| JP | 4118370 | 7/1999 |
| JP | 4118371 | 7/1999 |
| JP | 3548442 | 8/1999 |
| JP | 3622562 | 11/1999 |
| JP | 3424629 | 8/2000 |
| JP | 4860024 | 8/2000 |
| JP | 3063756 | 9/2000 |
| JP | 4629178 | 9/2000 |
| JP | 3063757 | 10/2000 |
| JP | 3511970 | 10/2000 |
| JP | 3551101 | 5/2001 |
| JP | 3427265 | 6/2001 |
| JP | 3646649 | 10/2001 |
| JP | 3780887 | 5/2002 |
| JP | 3890930 | 5/2002 |
| JP | 3786114 | 4/2004 |
| JP | 4904261 | 6/2004 |
| JP | 2007-214548 A | 8/2007 |
| JP | 2008-218746 A | 9/2008 |
| JP | 2008-277714 A | 11/2008 |
| KR | 10-2006-0027133 A | 3/2006 |

OTHER PUBLICATIONS

Preliminary Report on Patentability, PCT/US2010/051205, Dated May 30, 2012.

* cited by examiner

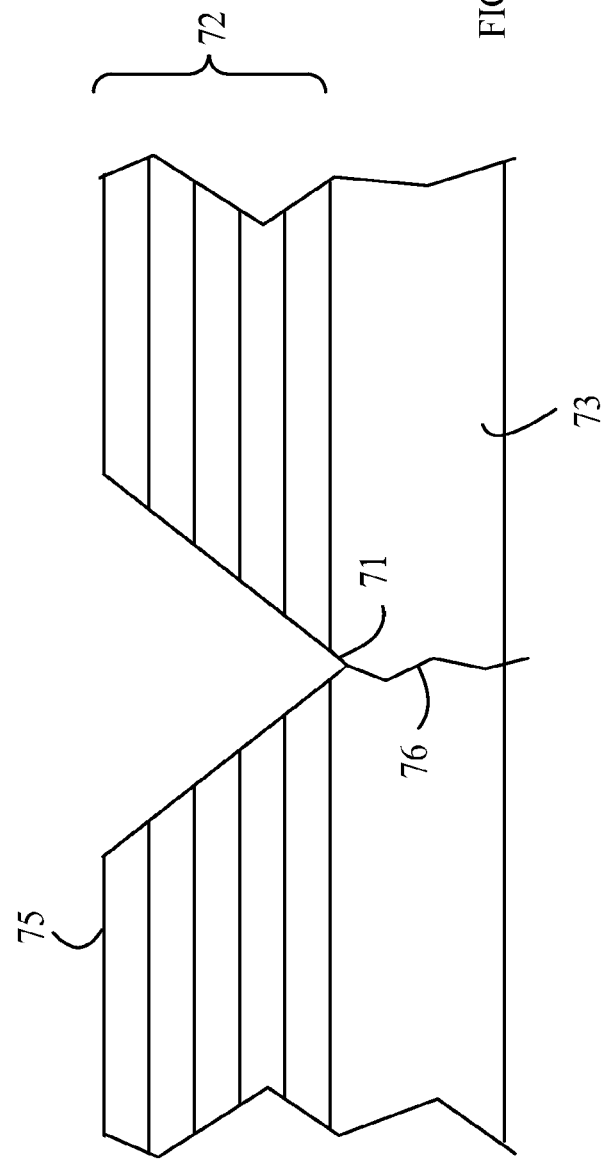

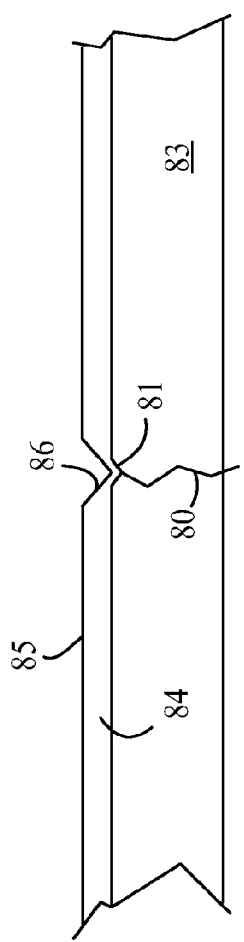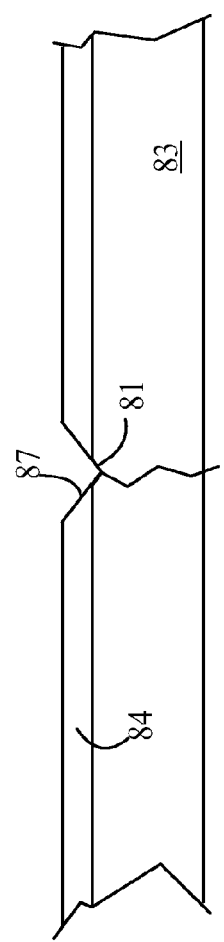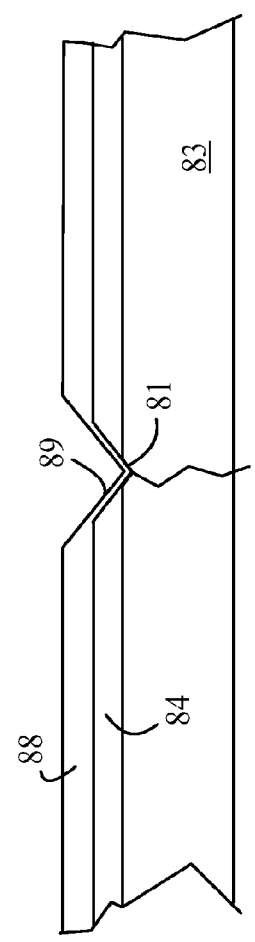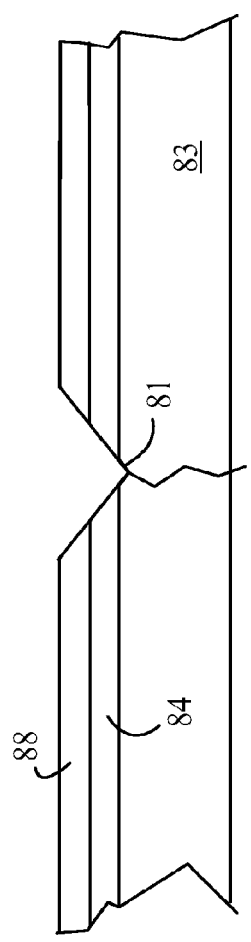

LED WITH IMPROVED INJECTION EFFICIENCY

This application is a Divisional of U.S. application Ser. No. 12/626,474, filed on Nov. 25, 2009, the contents of which are all herein incorporated by this reference in their entireties. All publications, patents, patent applications, databases and other references cited in this application, all related applications referenced herein, and all references cited therein, are incorporated by reference in their entirety as if restated here in full and as if each individual publication, patent, patent application, database or other reference were specifically and individually indicated to be incorporated by reference.

BACKGROUND OF THE INVENTION

Light emitting diodes (LEDs) are an important class of solid-state devices that convert electric energy to light. Improvements in these devices have resulted in their use in light fixtures designed to replace conventional incandescent and fluorescent light sources. The LEDs have significantly longer lifetimes and, in some cases, significantly higher efficiency for converting electric energy to light.

The cost and conversion efficiency of LEDs are important factors in determining the rate at which this new technology will replace conventional light sources and be utilized in high power applications. Many high power applications require multiple LEDs to achieve the needed power levels, since individual LEDs are limited to a few watts. In addition, LEDs generate light in relatively narrow spectral bands. Hence, in applications requiring a light source of a particular color, the light from a number of LEDs with spectral emission in different optical bands is combined or a portion of the light from the LED is converted to light of a different color using a phosphor. Thus, the cost of many light sources based on LEDs is many times the cost of the individual LEDs. To reduce the cost of such light sources, the amount of light generated per LED must be increased without substantially increasing the cost of each LED and without substantially lowering the conversion efficiency of the individual LEDs.

The conversion efficiency of individual LEDs is an important factor in addressing the cost of high power LED light sources. The conversion efficiency of an LED is defined to be the electrical power dissipated per unit of light that is emitted by the LED. Electrical power that is not converted to light in the LED is converted to heat that raises the temperature of the LED. Heat dissipation places a limit on the power level at which an LED operates. In addition, the LEDs must be mounted on structures that provide heat dissipation, which, in turn, further increases the cost of the light sources. Hence, if the conversion efficiency of an LED can be increased, the maximum amount of light that can be provided by a single LED can also be increased, and hence, the number of LEDs needed for a given light source can be reduced. In addition, the cost of operation of the LED is also inversely proportional to the conversion efficiency. Hence, there has been a great deal of work directed to improving the conversion efficiency of LEDs.

For the purposes of this discussion, an LED can be viewed as having three layers, the active layer sandwiched between a p-doped layer and an n-doped layer. These layers are typically deposited on a substrate such as sapphire. It should be noted that each of these layers typically includes a number of sub-layers. The overall conversion efficiency of an LED depends on the efficiency with which electricity is converted to light in the active layer. Light is generated when holes from the p-doped layer combine with electrons from the n-doped layer in the active layer.

The amount of light that is generated by an LED of a particular size can, in principle, be increased by increasing the current passing through the device, since more holes and electrons will be injected per unit area into the active layer. However, at high current densities, the efficiency with which holes combine with electrons to produce light decreases. That is, the fractions of holes recombine without producing light increases. Hence, as the current is increased through the device, the efficiency decreases and the problems associated with high operating temperatures increase.

SUMMARY OF THE INVENTION

The present invention includes a light emitting device and method for making the same. The light-emitting device includes an active layer sandwiched between a p-type semiconductor layer and an n-type semiconductor layer. The active layer emits light when holes from the p-type semiconductor layer combine with electrons from the n-type semiconductor layer therein. The active layer includes a number of sub-layers and has a plurality of pits in which the side surfaces of a plurality of the sub-layers are in contact with the p-type semiconductor material such that holes from the p-type semiconductor material are injected into those sub-layers through the exposed side surfaces without passing through another sub-layer.

In one aspect of the invention, each sub-layer includes a substantially planar surface that is in contact with the substantially planar surface of another of the sub-layers and a plurality of side surfaces, each side surface is bounded by a wall of one of the pits. Each sub-layer is characterized by a first hole current that enters that sub-layer through the substantially planar surface and a second hole current that enters that sub-layer through the side surfaces of the sub-layer, the second hole current is greater than 10 percent of the first hole current for at least one of the sub-layers.

In another aspect of the invention, the first and second semiconductor layers comprise GaN family materials and the pits are located at dislocations in the n-type semiconductor layer.

A light emitting device according to the present invention can be fabricated by growing an epitaxial n-type semiconductor layer on a substrate and growing an active layer that includes a plurality of sub-layers on the n-type semiconductor layer under growth conditions that cause pits to form in the active layer, a plurality of the sub-layers having sidewalls that are bounded by the pits. The portion of the active layer in the pits is etched to expose the sidewalls of the sub-layers in the pits. A p-type semiconductor layer is grown epitaxially over the active layer such that the p-type semiconductor layer extends into the pits and contacts the sidewalls of the sub-layers.

In one aspect of the invention, a plurality of the sub-layers are grown and then the sidewalls of the pits are etched to expose the sidewalls of the sub-layers. In another aspect of the invention, the sidewalls of the pits are etched after each sub-layer is grown to expose the sidewalls of the sub-layers that have been deposited at that point in the processing.

In yet another aspect of the invention, etching the active layer to expose the sidewalls includes changing a gas composition in an epitaxial growth chamber in which the device is fabricated to an atmosphere that etches facets of the active layer exposed in the pits faster than facets of the active layer that are not exposed in the pits. In the case of GaN-based devices, an atmosphere that includes $NH_3$ and/or $H_2$ can be used at an elevated temperature to perform the etching without removing the partially fabricated device from the epitaxial growth chamber.

BRIEF DESCRIPTION OF THE DRAWINGS

FIG. 6 is the same cross-sectional view as FIG. 5 after the sidewalls of the sub-layers have been etched.

FIGS. 7A-7D illustrate one embodiment of a method for growing the active layer that utilizes an etch after each sub-layer is grown.

DETAILED DESCRIPTION OF THE PREFERRED EMBODIMENTS OF THE INVENTION

Figure 1:
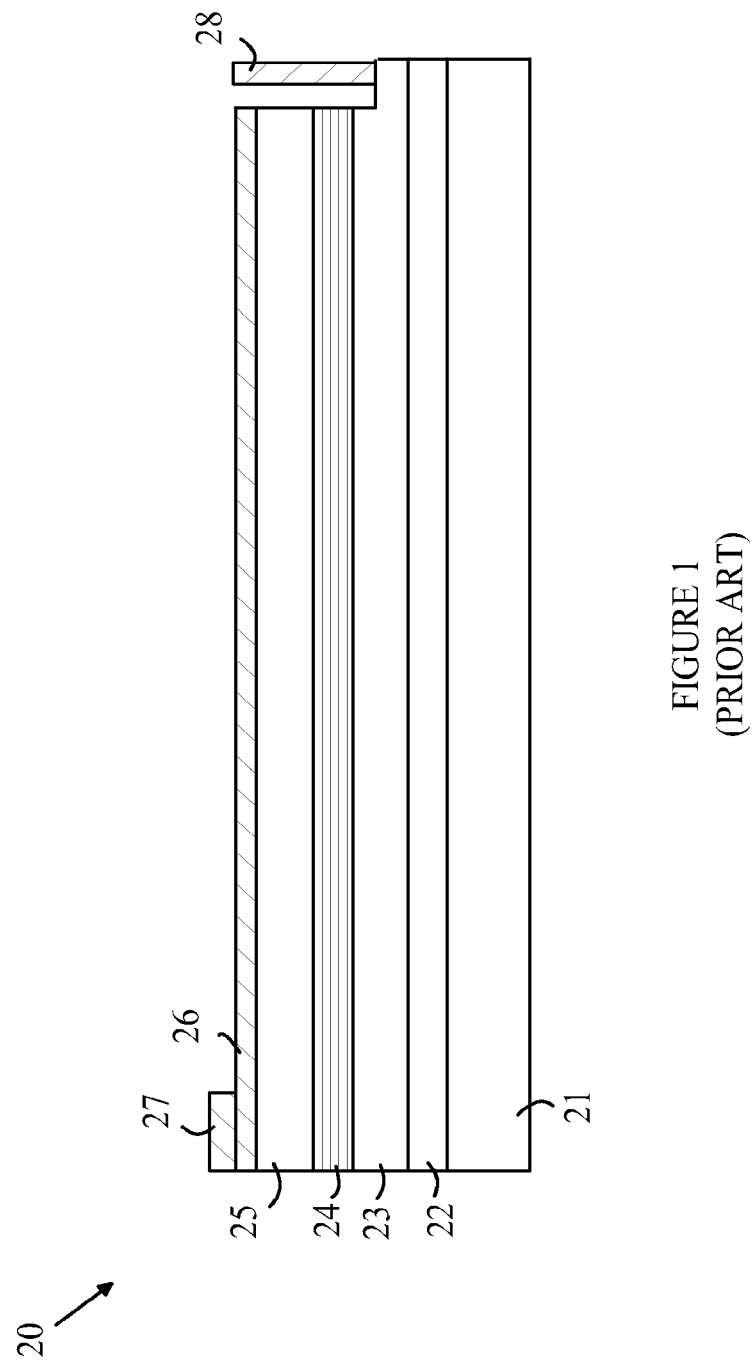
FIG. 1 is a cross-sectional view of a prior art LED.

The manner in which the present invention provides its advantages can be more easily understood with reference to FIG. 1, which is a cross-sectional view of a prior art LED. LED 20 is fabricated on a substrate 21 by depositing a number of layers on the substrate in an epitaxial growth chamber. Typically, a buffer layer 22 is deposited first to compensate for differences in the lattice constants between the lattice constant of the substrate and that of the material system making up the LED layers. For GaN-based LEDs, the substrate is typically sapphire. After buffer layer 22 is deposited, an n-type layer 23 is deposited followed by an active layer 24 and a p-type layer 25. The p-type layer is typically covered by a current spreading layer 26 in GaN LEDs to improve the current distribution through the p-type layer, which has a high resistivity. The device is powered by applying a voltage between contacts 27 and 28.

The active layer is typically constructed from a number of sub-layers. Each sub-layer typically includes a bather layer and a quantum well layer. Holes and electrons combine within the quantum well layer to generate light. Holes can also be lost within the quantum well layer in a manner that does not generate light. Such non-productive recombination events reduce the overall efficiency of the device. The fraction of the holes that are lost by non light-producing events depends on the density of holes within the quantum well layer, higher densities leading to a greater fraction of non-productive events. Holes that do not recombine in a particular sub-layer of the active layer enter the next lowest layer where the process is repeated. At low current densities, most of the holes eventually recombine in light producing events. At high current densities, most of the holes recombine in the first quantum well layer in non-productive processes, and hence, there are very few holes available for recombination in light-producing processes in the lower sub-layers of the active layer.

The present invention is based on the observation that the problems in the prior art system arise from attempting to inject all of the holes into the sub-layers of the active layers through the topmost sub-layer. The present invention overcomes this problem by providing a layered structure that allows holes to be injected in the lower sub-layers of the active layer without requiring that the holes pass through the top sub-layer. This approach lowers the density of holes in all of the sub-layers while maintaining the total number of holes that are available for light-producing recombination events in the active layer.

Figure 2:
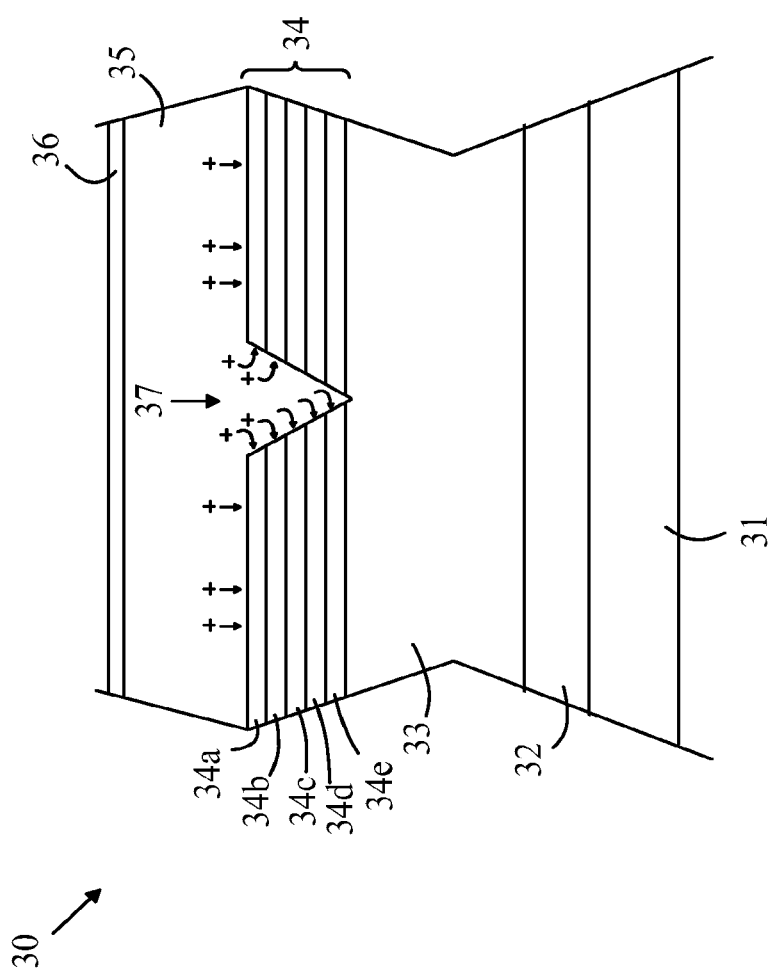
FIG. 2 is a cross-sectional view of a portion of an LED 30 according to one embodiment of the present invention.

Refer now to FIG. 2, which is a cross-sectional view of a portion of an LED 30 according to one embodiment of the present invention. LED 30 is fabricated on a substrate 31 by epitaxially growing a number of layers on substrate 31. The layers include a buffer layer 32, an n-type cladding layer 33, an active layer 34, and a p-type cladding layer 35. A current spreading layer 36 is deposited on the p-cladding layer. Active layer 34 includes a number of sub-layers 34a-34e as described above. To simplify the following discussion, sub-layer 34a will be referred to as the top-most sub-layer; however, this is merely a convenient label and does not imply any particular orientation relative to the earth. Active layer 34 also includes a number of "pits" 37 that extend through the sub-layers of the active layer. To simplify the drawing, only one such pit is shown in the drawing; however, as will be explained in detail below, there is large number of such pits in active layer 34. Cladding layer 35 extends into these pits, and hence, holes from cladding layer 35 can access the sub-layers of active layer 34 through the sidewalls of the pits as well as through the top surface of sub-layer 34a.

Consider layer 34b. In a prior art device, the only holes that entered the layer analogous to layer 34b were holes that entered layer 34a and did not combine in layer 34a. In LED 30, the holes that enter layer 34b are the holes that passed through layer 34a and the holes that entered layer 34b through the sidewalls of layer 34b that are exposed in the pits. Since LED 30 is powered from a constant current source, the total number of holes that are injected per unit time is substantially the same as the number of holes injected into a prior art device. Hence, the number of holes that enter layer 34a through the top surface thereof is reduced by the number of holes that enter the various sub-layers through the sidewalls of those sub-layers. If the density of pits is sufficiently high, the density of holes in sub-layer 34a is substantially reduced, and the density of holes in the underlying sub-layers is substantially increased while maintaining the same hole current through the LED as that utilized in the prior art configuration. As a result, the overall efficiency of LED 30 is substantially increased relative to prior art devices at those current densities that lead to non-productive hole recombination events.

Figure 3:
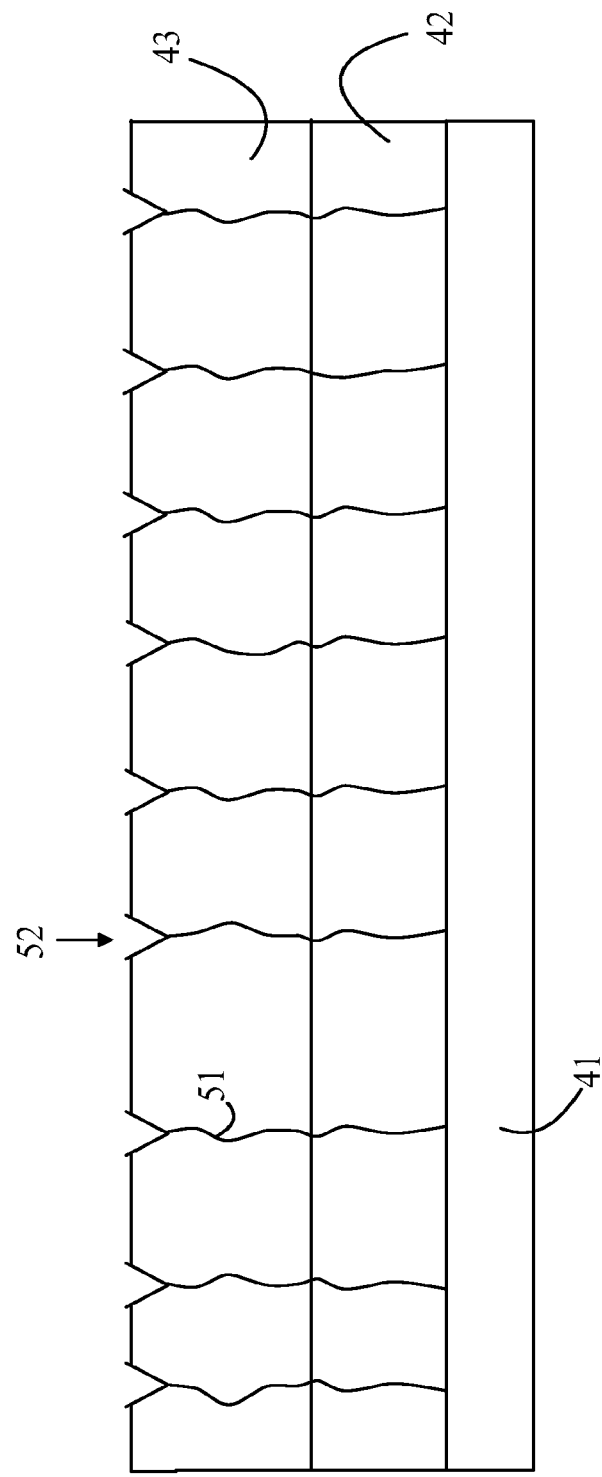
FIG. 3 is a cross-sectional view of a portion of the GaN layers through the n-cladding layer of a typical GaN LED formed on a sapphire substrate.

In one aspect of the present invention, the pits in the active layer are formed with the aid of the dislocations that arise from the difference in lattice constant between the materials from which the LED is constructed and the underlying substrate. For example, GaN-based LEDs that are fabricated on sapphire substrates include vertically propagating dislocations that result from the difference in lattice constant between the GaN-based materials and the sapphire substrate. Refer now to FIG. 3, which is a cross-sectional view of a portion of the GaN layers through the n-cladding layer of a typical GaN LED formed on a sapphire substrate. The GaN layers are deposited on a sapphire substrate 41 whose lattice constant differs from the GaN layers. The difference in lattice constant gives rise to dislocations that propagate through the various layers as the layers are deposited. An exemplary dislocation is labeled at 51. The density of such dislocation is typically $10^7$ to $10^{10}$ per $cm^2$ in a GaN LED deposited on a sapphire substrate. The number of dislocations that propagate into the n-cladding layer 43 depends on the nature of a buffer layer 42 and the growth conditions under which buffer layer 42 and n-cladding layer 43 are deposited. The dislocations give rise to small pits on the surface of the upper most layer of material such as pit 52. The size of these pits depends on the growth conditions under which the GaN material is deposited during the epitaxial growth of the layers.

Figure 4:
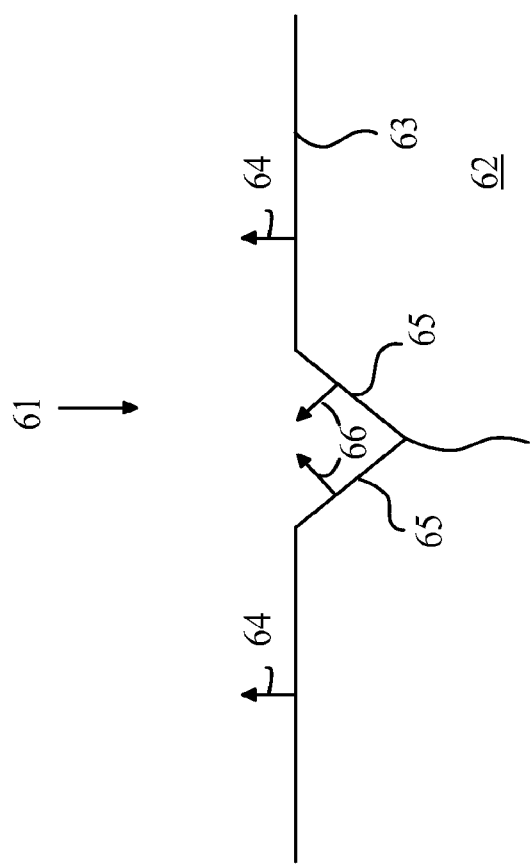
FIG. 4 is an expanded cross-sectional view of a pit in a GaN layer during the growth of that layer.

Refer now to FIG. 4, which is an expanded cross-sectional view of a pit 61 in a GaN layer 62 during the growth of that layer. During the growth phase, material is added to the crystal facets of layer 62 as shown by arrows 64 and 66. The crystal facet shown at 63 is typically the c-facet of the GaN crystal. At the dislocations, additional facets such as facets 65 are exposed in addition to facet 63. The rate of growth on the different facets can be adjusted by the growth conditions. The rate of growth on the different facets can be adjusted by the growth conditions such that the rate of growth of the facets 65 exposed in the pit is greater than or less than that of the rate of growth of the facet 63. If the rate of growth of facets 65 is less than that of facet 63, the size of the pit will increase as material is deposited.

Figure 5:
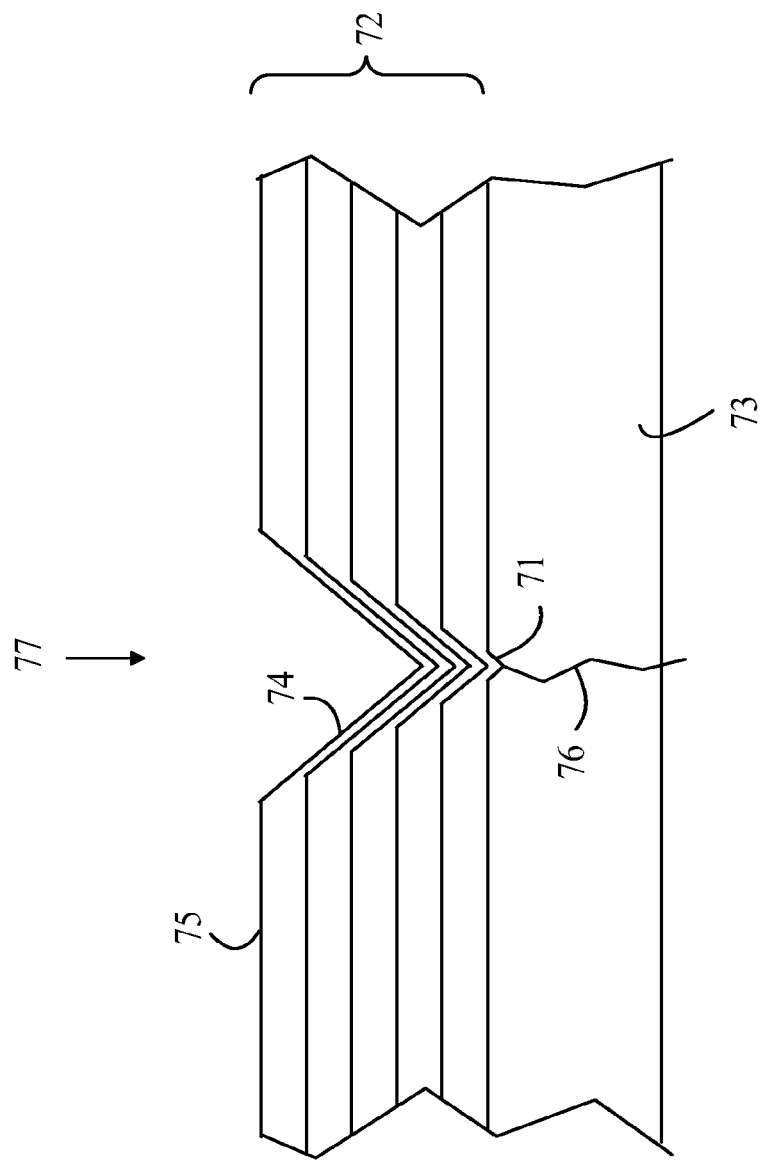
FIG. 5 is a cross-sectional view of a portion of an LED in the vicinity of a pit that is grown over a dislocation that had a small pit on the top surface of an n-cladding layer.

Refer now to FIG. 5, which is a cross-sectional view of a portion of an LED in the vicinity of a pit 77 that is grown over a dislocation 76 that had a small pit 71 on the top surface of an n-cladding layer 73. The growth conditions are chosen such that the rate of growth on crystal facet 74 is substantially less than that on crystal facet 75. This is accomplished by choosing growth conditions that suppress the surface mobility of the materials that are deposited such that the natural tendency of these materials to smooth the surface as the materials are deposited is suppressed. For example, in the InGaN/GaN active region, the GaN barrier layers can be grown using a combination of V/III ratio, growth rate, and growth temperature that minimizes the growth rate on the facet on facet 74. Each of these 3 parameters has a strong effect on the surface mobility of the atoms on the growing surface, and hence, can be manipulated to cause the pit size to increase as the layer is grown. As the various sub-layers of active layer 72 are grown, the size of the pit increases. As a result, the thickness of the sub-layers in the pit is substantially thinner than the thickness of the sub-layers in the regions outside the pit.

In one aspect of the present invention, all of the sub-layers of the active layer are grown and then the material on facet 74 is removed by selectively etching the active layer using an etchant that attacks material on facet 74 faster than material on facet 75. This leaves the side walls of the sub-layers exposed as shown in FIG. 6, which is the same cross-sectional view as FIG. 5 after the sidewalls of the sub-layers have been etched.

For example, the etching operation can be accomplished in the same growth chamber by introducing $H_2$ into the growth chamber after the growth of the sub-layers has been completed. The growth conditions can be set to enhance etching of the desired facets by utilizing a growth temperature that is greater than or equal to 850° C. using an ambient containing $NH_3$ and $H_2$. In the absence of any group III materials, this ambient will etch the facets at a much higher rate than the c-plane material. Over time, the pits will open up due to the difference in etch rate between the facets and the c-plane material, and hence, expose the sidewalls of the sub-layers.

The material can also be etched chemically using a solution that preferentially etches the crystal facet relative to the c-plane face. For chemical etching, molten KOH can be used to etch the facets. Also, hot solutions of $H_2SO_4:H_3PO_4$ can be used to etch the material at temperatures greater than 250° C. This method requires the removal of the wafer from the growth chamber, and hence, is not preferred.

In the above examples, all of the sub-layers of the active layer are grown and then the sidewalls of the pits are selectively etched either in situ or by removing the wafer from the epitaxial growth chamber and utilizing a chemical etch. However, methods in which the sidewalls in the pits are selectively etched at the end of each deposition of each sub-layer can also be utilized. In such methods, the gaseous etch described above is utilized in situ after the deposition of each sub-layer.

Refer now to FIGS. 7A-7D, which illustrate one embodiment of a method for growing the active layer that utilizes an etch after each sub-layer is grown. Referring to FIG. 7A, a first sub-layer 84 of the active layer is deposited over the n-type cladding layer 83, which has a pit 81 that is the result of a dislocation 80. Sub-layer 84 is deposited under conditions in which the growth rate of facet 85 is much faster than that on facet 86. After sub-layer 85 is grown, the atmosphere in the growth chamber is switched to the etching atmosphere discussed above for a short period of time. For example, the etching atmosphere could be set as a pause step for 1 minute at a temperature that is greater than 850° C. using an ambient containing $NH_3$ and $H_2$. As a result, the sidewall of sub-layer 87 on facet 86 is preferentially etched back, exposing the sidewalls of the pits such as pit 81 as shown in FIG. 7B.

The chamber is then switched back to the epitaxial growth mode and a second active layer, sub-layer 88, is deposited under the same growth conditions that were used to deposit sub-layer 84 as shown in FIG. 7C. The sidewall of sub-layer 88 extends into pit 81 and covers the exposed sidewall of sub-layer 84 in the pit. The chamber atmosphere is then switched back to the etching atmosphere and the sidewall 89 of layer 88 is etched back leaving both the sidewalls of sub-layers 84 and 88 exposed in the pit as shown in FIG. 7D. This process is repeated until all of the sub-layers of the active layer are deposited. The p-cladding layers and other layers are then deposited such that the p-cladding layer is in direct contact with the exposed sidewalls of the sub-layers of the active layer.

While the resulting structure is substantially the same as that obtained by utilizing the in situ stack etching procedure, the control of the etching at the individual sub-layer depositions is easier to control. For example, if the entire stack is etched at once, the last sub-layer will be significantly reduced in thickness in the planar regions between the pits. Hence, the last sub-layer thickness must be thicker to compensate for the loss in material. Thus the last sub-layer is different from the other sub-layers. If the sub-layers are etched one at a time, then all of the sub-layers will be identical.

The present invention provides its advantages by injecting a significant fraction of the holes into the active layer through the sidewalls of the sub-layers of the active region. The fraction of the hole current that is injected into the active region through the sidewalls depends on the density of pits that are introduced into the active layer. If the density of pits is too small, most of the hole current will enter the active layer through the top surface of the uppermost sub-layer of the active layer. Hence, the density of pits must be sufficient to assure that a significant fraction of the hole current enters through the sidewalls of the sub-layers that are exposed in the pits.

However, there is an upper limit on the density of pits that can be advantageously utilized. It should be noted that light is, at best, generated with reduced intensity in the pits, since a significant fraction of the active layer in the pits has been removed.

Accordingly, the density of pits is preferably adjusted to a level that allows at least 10 percent of the hole current to be injected into the sidewalls of the active layer sub-layers while maintaining the light output above that obtained without the sidewall injection scheme of the present invention. In practice, a pit density in the range of $10^7$ to $10^{10}$ pits per $cm^2$ is sufficient.

The density of pits in LEDs that utilize dislocations in the LED layers can be controlled by choosing the substrate on which the layers are deposited and by varying the growth conditions during the deposition of the n-type layers and any buffer layers on which these layers are deposited. The density of dislocations can be increased by choosing a substrate having a greater mismatch lattice constant with that of the n-type layers and/or by adjusting the growth conditions of the buffer layers that are deposited on the substrate prior to depositing the n-cladding layer. In addition to the sapphire substrates discussed above, SiC, AlN, and Silicon substrates could be utilized to provide different degrees of mismatch.

As noted above, one or more buffer layers of material are typically deposited on the substrate under conditions that reduce the number of dislocations that propagate into the n-cladding layer. Altering the growth conditions of the buffer layer and other layers deposited on the buffer layer also alters the density of dislocations. Growth parameters such as the V/III ratio, temperature, and growth rate all have significant effects on the dislocation density if they are changed in the early layers of the structure. Normally, these parameters are chosen to reduce the density of dislocations; however, the present invention can utilize these parameters to increase the level of dislocations.

The above-described embodiments utilize the GaN family of materials. For the purposes of this discussion, the GaN family of materials is defined to be all alloy compositions of GaN, InN and AlN. However, embodiments that utilize other material systems and substrates can also be constructed according to the teachings of the present invention.

The above-described embodiments are described in terms of "top" and "bottom" surfaces of the various layers. In general, the layers are grown from the bottom surface to the top surface to simplify the discussion. However, it is to be understood that these are merely convenient labels and are not to be taken as requiring any particular orientation with respect to the Earth.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A method for fabricating a light emitting device comprising:
    growing an epitaxial n-type semiconductor layer on a substrate, said epitaxial n-type semiconductor layer including random dislocations;
    growing an active layer comprising a plurality of sub-layers on said epitaxial n-type semiconductor layer under growth conditions that cause pits to form in said active layer, said pits located on said random dislocations, a plurality of said sub-layers having sidewalls that are bounded by said pits;
    etching said active layer to expose sidewalls of said sub-layers in said pits;
    growing an epitaxial p-type semiconductor layer over said active layer such that said epitaxial p-type semiconductor layer extends into said pits and contacts said exposed sidewalls of said sub-layers; and
    providing contacts for applying a potential difference between said epitaxial p-type semiconductor layer and said epitaxial n-type semiconductor layer.

2. The method of claim 1 wherein said epitaxial n-type semiconductor layer has a lattice constant that is different from that of said substrate, said difference giving rise to dislocations and wherein said pits are formed at locations having said dislocations.

3. The method of claim 1 wherein etching said active layer to expose said sidewalls comprises changing a gas composition in an epitaxial growth chamber in which said device is being fabricated to an atmosphere that etches facets of said active layer exposed in said pits faster than facets of said active layer that are not exposed in said pits.

4. The method of claim 1 wherein said active layer is grown on a c-plane facet of a material in a GaN family of materials and wherein etching said active layer to expose said sidewalls comprises chemically etching said active layer with an etchant that etches crystal facets in said pits faster than material on said c-plane facet.

5. The method of claim 3 wherein said atmosphere comprises $NH_3$ and/or $H_2$.

6. The method of claim 2 wherein said epitaxial n-type semiconductor layer is grown under conditions that result in a density of dislocations between $10^7\ cm^{-2}$ and $10^{10}\ cm^{-2}$.

7. The method of claim 1 wherein etching said active layer to expose said sidewalls comprises etching one of said sub-layers after that sub-layer has been deposited to expose said sidewalls of that sub-layer in said pits prior to depositing another sub-layer on that sub-layer.

8. The method of claim 1, wherein holes are injected from said epitaxial p-type semiconductor layer into said active layer, and said active layer and said epitaxial p-type semiconductor layer are formed so that at least 10 percent of said holes are injected from said epitaxial p-type semiconductor layer into said active layer through said exposed sidewalls of said sub-layers.

\* \* \* \* \*